US010416196B2

(12) United States Patent
Urankar

(10) Patent No.: US 10,416,196 B2
(45) Date of Patent: Sep. 17, 2019

(54) CURRENT SENSOR AND DEVICE FOR MEASURING AN ELECTRICAL CURRENT

(71) Applicant: Schneider Electric Industries SAS, Rueil-Malmaison (FR)

(72) Inventor: Lionel Urankar, Fontaine (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 374 days.

(21) Appl. No.: 15/341,614

(22) Filed: Nov. 2, 2016

(65) Prior Publication Data

US 2017/0146572 A1    May 25, 2017

(30) Foreign Application Priority Data

Nov. 23, 2015 (FR) ...................... 15 61228

(51) Int. Cl.
*G01R 15/18* (2006.01)
*G01R 19/00* (2006.01)
*G01R 21/00* (2006.01)
*G05B 11/01* (2006.01)
*H02H 3/08* (2006.01)

(52) U.S. Cl.
CPC ....... *G01R 15/181* (2013.01); *G01R 19/0092* (2013.01); *G01R 21/00* (2013.01); *G05B 11/01* (2013.01); *H02H 3/08* (2013.01)

(58) Field of Classification Search
None
See application file for complete search history.

(56) References Cited

U.S. PATENT DOCUMENTS 6,018,239 A    1/2000  Berkcan et al.
6,313,623 B1 *  11/2001  Kojovic ............... G01R 15/181
                                              324/127

(Continued)

FOREIGN PATENT DOCUMENTS

EP    0 838 686 A2    4/1998
EP    1 596 206 A1   11/2005

(Continued)

OTHER PUBLICATIONS

French Preliminary Search Report dated Sep. 2, 2016 in French Application 15 61228 filed on Nov. 23, 2015 (with English Translation of Cited Documents).

(Continued)

*Primary Examiner* — Thienvu V Tran
*Assistant Examiner* — David M Stables
(74) *Attorney, Agent, or Firm* — Oblon, McClelland, Maier & Neustadt, L.L.P.

(57) ABSTRACT

A current sensor of Rogowski type including two layers of coils surrounding a current conductor, each layer of coils including a plurality of windings wound on a plurality of axes forming the contour of polygons of identical forms, arranged on parallel planes, and placed facing one another such that each corner zone of the first polygon is situated facing a corresponding corner zone of the second polygon and such that, in each corner zone, turns of the winding of the first layer of coils have different orientations from those of the turns of the winding of the second layer of coils in the facing corner zone.

14 Claims, 8 Drawing Sheets

(56) References Cited

U.S. PATENT DOCUMENTS

2004/0178875 A1* 9/2004 Saito .................... G01R 15/181
336/200
2005/0253573 A1   11/2005 Budillon et al.
2012/0049839 A1   3/2012 Kiendl

FOREIGN PATENT DOCUMENTS

FR           2 507 811        12/1982
WO    WO 2013/037986 A1    3/2013

OTHER PUBLICATIONS

D. Gerber, et al., "IGBT Gate-Drive With PCB Rogowski Coil for Improved Short Circuit Detection and Current Turn-Off Capability", Pulsed Power Conference (PPC), IEEE, 2011, 6 pgs.
Dominic Gerber, et al., "Gate Unit With Improved Short-Circuit Detection and Turn-Off Capability for 4.5-kV Press-Pack IGBTs Operated at 4-kA Pulse Current", IEEE Transactions on Plasma Science, vol. 41, (10), 2013, 8 pgs.
Mauricio Rigoni, et al., "Rogowski coil current meters in nonconventional applications", IEEE Potentials, vol. 27, (4), 2008, 6 pgs.

* cited by examiner

CURRENT SENSOR AND DEVICE FOR MEASURING AN ELECTRICAL CURRENT

TECHNICAL FIELD

The present invention relates to a sensor intended for measuring a current in an electrical conductor. It applies more particularly to the measurement of alternating currents, in industrial settings.

The invention also relates to an apparatus for measuring electrical power or energy or to an apparatus for protecting or controlling electrical distribution circuits, such as a circuit breaker or contactor, comprising at least one such current sensor.

PRIOR ART

Current sensors are used in apparatuses for measuring electrical current, power or energy as well as in apparatuses for protecting or controlling electrical distribution facilities such as circuit breakers, contactors, switches.

Among current sensors, the use of inductive sensors of Rogowski type is widely described in the literature.

Current sensors of Rogowski type comprise a support made of a magnetic material placed around an electrical conductor also called a current line in which the current to be measured flows. A conducting wire is wounded on the support to form a secondary winding. The whole forms a transformer where the said current line constitutes a primary winding and the said secondary winding provides a measurement signal representative of the derivative of the current flowing in the current line.

The absence of any magnetic core at risk of being saturated by the magnetic field generated by the current in the current line, allows the sensor to have very good linearity of response over a wide dynamic range of primary current. This quality is highly beneficial in current measurement.

On the other hand, the magnetic field generated in the secondary winding by the current flowing in the current line is much weaker than in the case of a sensor comprising a magnetic circuit, thereby rendering the Rogowski sensor more sensitive to external electromagnetic disturbances, for example to the fields generated by another current line placed outside the support, in proximity to the sensor. This sensitivity to external disturbances will be all the more significant the lower the current to be measured in the primary conductor, the signal-to-noise ratio being, in this case, likewise low.

Moreover, a polygonal shape, in particular rectangular or square, is more suitable than a conventional circular shape of the Rogowski sensor for installation in a measuring device, generally of parallelepipedal shape, since the space is better filled. The gain of a Rogowski torus being proportional to the number of turns and to the area of each turn, it is possible to maximize the gain of a sensor of polygonal shape:

- by using a rectangular or square turn cross-section, the area of each turn will be greater than that of a round turn of diameter equal to the side of the equivalent square or rectangle,
- by using a square or rectangular support, the mean perimeter of the sensor will be greater than the perimeter of a circular support of equivalent bulk, and therefore, for equivalent coiling thickness, it will be possible to coil a larger number of turns on the square or rectangular support.

However, for a polygonal sensor such as this, it is no longer possible to keep the number of turns per unit length constant in the corners since they represent points of high discontinuity and it is known that in order to minimize the influence of external electromagnetic fields, it is necessary for the coiling pitch to be constant over the entire length of the winding.

Various embodiments aimed at solving this dilemma are known: patent EP1596206 describes a current measuring device comprising a secondary winding formed by at least three coils, the local inductance of at least one of whose ends is greater than the local inductance towards the central part of the coils.

Patent EP0838686 describes a current measuring device comprising a secondary winding formed by at least four coils. The missing turns in the corners is compensated for by disposing the four coils in such a way that each coil end is overlapped partially or totally by the coil adjacent to it.

These solutions do not entirely address the problem related to the influence of exterior fluxes on the measurement of electric current, in particular in the case of a three-phase electrical facility highly unbalanced by single-phase loads, and more particularly to obtain increased measurement accuracy in the case of the measurement of a low current in the primary conductor.

DISCLOSURE OF THE INVENTION

The invention is therefore aimed at remedying the drawbacks of the prior art by proposing a device for measuring an electric current, capable of delivering a signal suitable for accurate measurement of the current, very insensitive to exterior electromagnetic disturbances and of suitable shape for installation in a compact industrial apparatus.

A current sensor according to the invention comprises at least two layers of coils surrounding a current conductor so as to perform a measurement of a current flowing in the said conductor:

- a first layer of coils comprises a plurality of windings linked together, each winding having a longitudinal coiling axis arranged in a first plane, the crossover of the axes forming corner zones corresponding to the vertices of a first polygon, each coiling axis forming a side of the said first polygon,
- a second layer of coils comprises a plurality of windings linked together, each winding having a longitudinal coiling axis arranged in a second plane, parallel to the first plane, the crossover of the axes forming corner zones corresponding to the vertices of a second polygon, each coiling axis forming a side of the said second polygon.

Each winding of each of the layers of windings consists of turns oriented substantially perpendicularly to the coiling axis.

The first polygon comprises a plurality of corner zones, each of the corner zones being formed by a vertex of the polygon.

The second polygon is of identical shape to the first polygon and likewise comprises a plurality of corner zones, each of the corner zones being formed by a vertex of the second polygon.

The first and second polygons are placed facing one another such that each corner zone of the first polygon is respectively situated facing each corresponding corner zone of the second polygon.

In each corner zone, the orientation of the turns of the winding of the first layer of coils is different from the orientation of the turns of the winding of the second layer of coils in the facing corner zone. Each corner zone is occupied by an end of a single winding and an end of an adjacent winding extends substantially as far as a side of the winding occupying the said corner zone.

The first polygon comprises a plurality of substantially rectilinear zones, each of the rectilinear zones being formed by a side of the said polygon. In the same manner, the second polygon also comprises a plurality of substantially rectilinear zones, each of the rectilinear zones being formed by a side of the second polygon. Each rectilinear zone of the first layer of coils is respectively situated facing a corresponding rectilinear zone of the second layer of coils. The coiling axis of the windings of the first layer of coils in each rectilinear zone of the first support is parallel to the coiling axis of the windings of the second layer of coils in the facing rectilinear zone of the second support.

The windings of the first layer of coils and of the second layer of coils of the current sensor are each wound on a support of non-magnetic type. The coiling pitch of the windings of the first layer of coils and of the windings of the second layer of coils is substantially constant.

The windings of the first layer of coils are linked in series and the windings of the second layer of coils are linked in series.

The direction of coiling of the windings of the first layer of coils is preferentially reversed with respect to the direction of coiling of the windings of the second layer of coils.

The shape of the first and second polygons is preferentially a rectangle or a square. According to this embodiment, in each corner zone, the turns of the winding of the first layer of coils are oriented substantially at right angles with respect to the turns of the winding of the second layer of coils in the facing corner zone.

The coils of the current sensor can be produced according to a printed circuit technique, to a technique of depositing conducting material on an insulating support based on silk-screen printing or else based on three-dimensional printing, this list being nonlimiting.

According to the invention, an apparatus for measuring electrical power or energy, such as an ammeter or a wattmeter, comprises at least one current sensor. Preferentially, a first end of the first layer of coils is linked to a reference potential of the measuring apparatus, a second end of the first layer of coils is linked to a first input of an amplifier, preferentially of differential amplifier type, a first end of the second layer of coils is linked to the said reference potential of the measuring apparatus and a second end of the second layer of coils is linked to a second input of the amplifier. At least one processing circuit is connected to at least one current sensor, the said processing circuit being suitable for performing the measurement of a signal representative of the current flowing in the current conductor.

An electrical trip unit according to the invention, comprises at least one current sensor and at least one processing circuit connected to the said current sensor so as to receive at least one signal representative of the current flowing in the current conductor.

A switching device comprises an electrical trip unit comprising at least one sensor according to the invention, a mechanism for opening the electrical contacts, the electrical trip unit being linked to the opening mechanism so as to open the contacts of the switching device.

BRIEF DESCRIPTION OF THE DRAWINGS

Other advantages and characteristics will emerge more clearly from the description which follows of particular embodiments of the invention that are given by way of nonlimiting examples, and represented in the appended drawings in which.

DETAILED DESCRIPTION OF PREFERRED EMBODIMENTS

Figure 1:
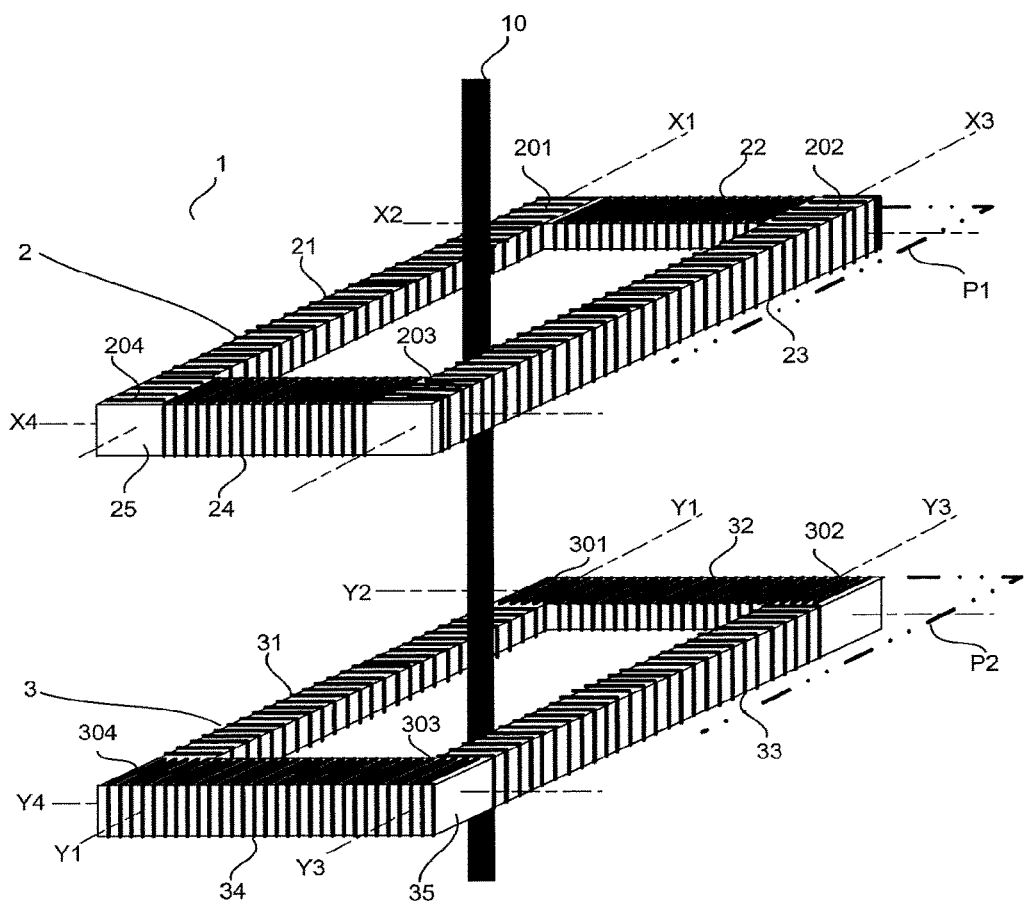
FIG. 1 represents a perspective view of the sensor according to a preferential embodiment.

According to the preferred embodiment of the invention, represented in FIG. 1, the current sensor 1 comprises a first layer of coils 2 and a second layer of coils 3 arranged around the current line 10. The current to be measured flows in the current line 10.

The first layer of coils 2 comprises a plurality of windings 21, 22, 23, 24, produced by coiling a conducting wire on a support 25. The said windings are linked electrically in series. The winding 21 is coiled along an axis X1, the winding 22 is coiled along an axis X2, the winding 23 is coiled along an axis X3, the winding 24 is coiled along an axis X4. The axes X1, X2, X3, X4 are arranged in one and the same plane P1.

The axis X1, X2, X3, X4 are substantially rectilinear, X1 is substantially perpendicular to X2 and to X4, X3 is substantially perpendicular to X2 and to X4.

The second layer of coils 3 comprises a plurality of windings 31, 32, 33, 34, produced by coiling a conducting wire on a support 35. The said windings are linked electrically in series. The winding 31 is coiled along an axis Y1, the winding 32 is coiled along an axis Y2, the winding 33 is coiled along an axis Y3, the winding 34 is coiled along an axis Y4. The axes Y1, Y2, Y3, Y4 are arranged in one and the same plane P2.

The axes Y1, Y2, Y3, Y4 are substantially rectilinear, Y1 is substantially perpendicular to Y2 and to Y4, Y3 is substantially perpendicular to Y2 and to Y4.

The first layer of coils 2 and the second layer of coils 3 are placed in proximity to one another, preferentially as close as possible, the plane P1 being substantially parallel to the plane P2.

The axis X1 is substantially parallel to the axis Y1, the axis X2 is substantially parallel to the axis Y2, the axis X3 is substantially parallel to the axis Y3 and the axis X4 is substantially parallel to the axis Y4.

The supports 25 and 35 are preferentially identical in shape and in dimensions so that the turns of the layer of coils 2 are identical to the turns of the layer of coils 3. The supports 25 and 35 are also preferentially identical in composition.

Figure 2A:
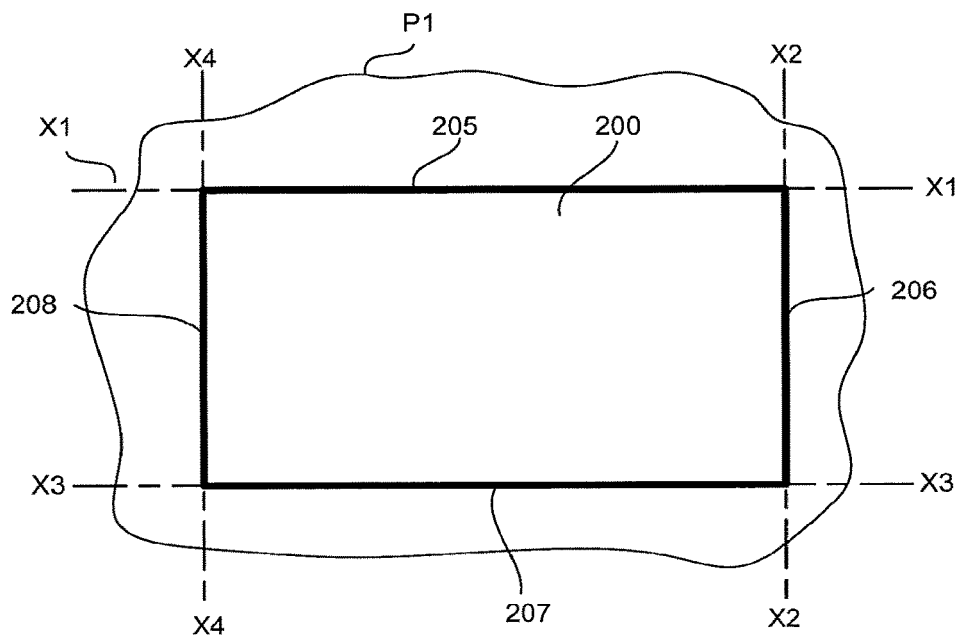
FIGS. 2A and 2B represent a preferential polygonal shape of the sensor.

According to FIG. 2A, the axes X1, X2, X3, X4 form the contour of a first polygon 200, preferentially a rectangle. The said polygon 200 comprises four sides: 205, 206, 207 and 208. A first side 205 of the polygon 200 is formed along the axis X1, a second side 206 of the polygon 200 is formed along the axis X2, a third side 207 of the polygon 200 is formed along the axis X3 and a fourth side 208 of the polygon 200 is formed along the axis X4. This contour also forms the length of the layer of coils 2.

Figure 2B:
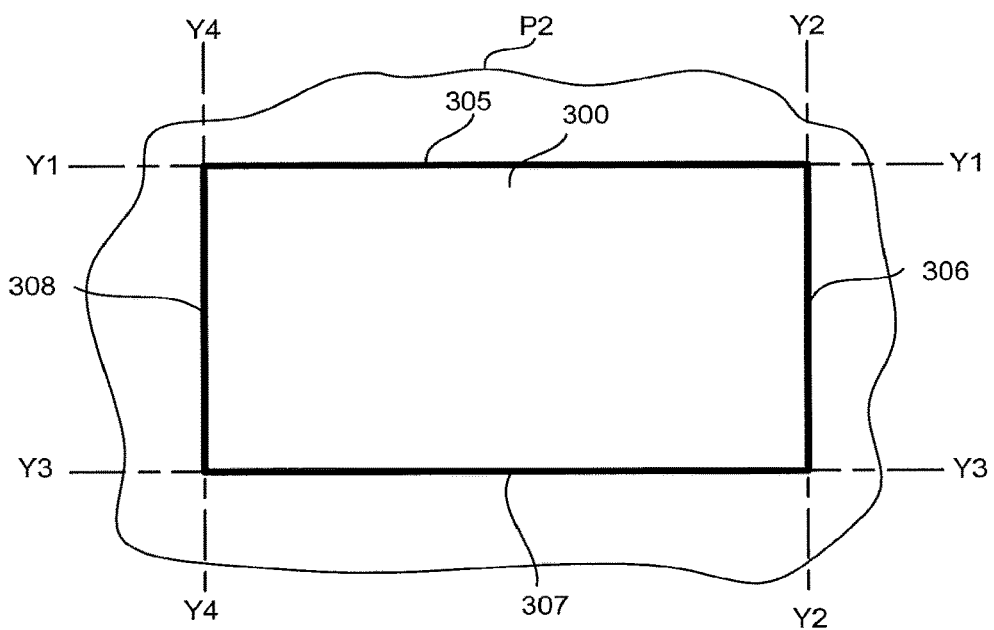

According to FIG. 2B, the axes Y1, Y2, Y3, Y4 form the contour of a second polygon 300, preferentially a rectangle. The said polygon 300 comprises four sides: 305, 306, 307 and 308. A first side 305 of the polygon 200 is formed along the axis Y1, a second side 306 of the polygon 200 is formed along the axis Y2, a third side 307 of the polygon 200 is formed along the axis Y3 and a fourth side 308 of the polygon 200 is formed along the axis Y4. This contour also forms the length of the layer of coils 3.

According to the preferential embodiment represented in FIG. 1, the first layer of coils 2 comprises four corner zones. A first corner zone 201 is located in the intersection zone between the axes X1 and X2, a second corner zone 202 is located in the intersection zone between the coiling axes X2 and X3, a third corner zone 203 is located in the intersection zone between the coiling axes X3 and X4, and a fourth corner zone 204 is located in the intersection zone between the coiling axes X1 and X4.

In the same manner, according to the preferential embodiment, the second layer of coils 3 comprises four corner zones. A first corner zone 301 is located in the intersection zone between the axes Y1 and Y2, a second corner zone 302 is located in the intersection zone between the coiling axes Y2 and Y3, a third corner zone 303 is located in the intersection zone between the coiling axes Y3 and Y4, and a fourth corner zone 404 is located in the intersection zone between the coiling axes Y1 and Y4.

The corner zones 201 and 301 are facing one another. The same holds for the corner zones 202 and 302, 203 and 303, 204 and 304 respectively.

Figure 3A:
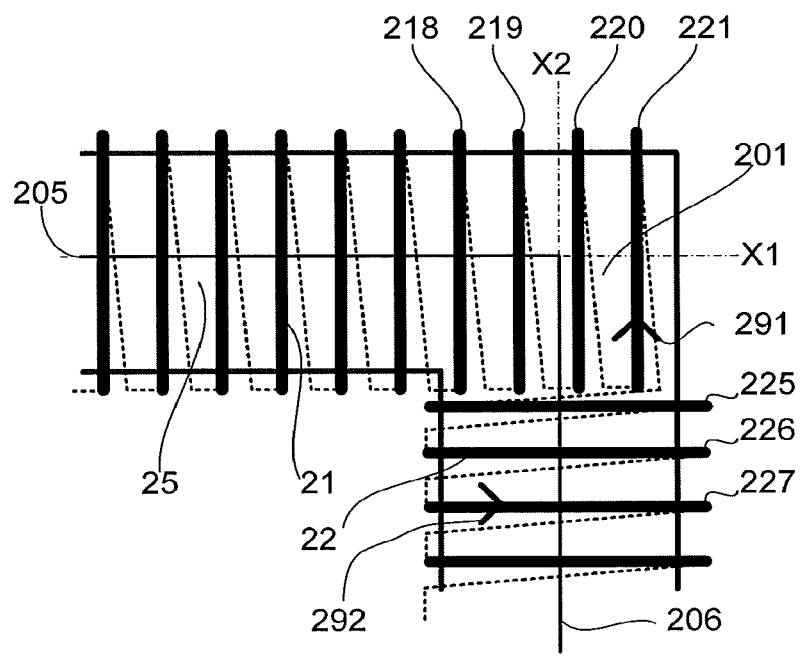
FIGS. 3A and 3B represent views from above of the installation of the turns of two layers of coils of the sensor in two facing corner zones.

FIG. 3A represents, according to a preferred embodiment, a view from above of the installation of the windings 21 and 22 in the corner zone 201 of the first layer of coils 2. The turns 218 to 221 of the first winding 21 are coiled along the axis X1. The orientation of the turns in the corner zone 201 is perpendicular to the axis X1. Preferentially, $N_{corner}$ turns 220 to 221 are coiled along the axis X1, at the end of the winding 21, in the corner zone 201.

The corner zone 201 being occupied by the winding 21, an end of the winding 22 extends substantially as far as a side of the winding 21. The turn 225 situated at the end of the winding 22 as well as the other turns of the winding 22 are oriented perpendicularly with respect to the turns 218 to 221 of the winding 21.

It is therefore apparent that the number of turns per unit length along the axis X2 is not constant over the contour of the polygon 200: preferentially, the coiling axes X1 and X2 also being axes of symmetry of the support 25, $N_{corner}$ turns are consequently missing from the winding 22 along the axis X2.

Figure 3B:
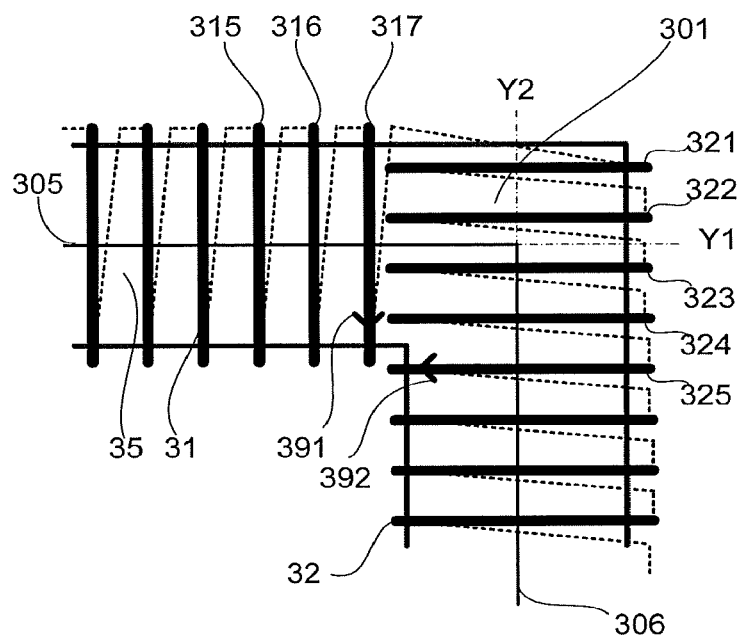

FIG. 3B represents, according to a preferred embodiment, a view from above of the installation of the windings 31 and 32 of the second layer of coils 3, in the corner zone 301, situated opposite the corner zone 201. The turns 321, 322, 323, 324 of the second winding 32, coiled along the axis Y2, occupy the corner zone 301. The orientation of the turns in the corner zone 301 is perpendicular to the axis Y2. Preferentially, $N_{corner}$ turns 321, 322 are coiled along the axis Y2, before the turns 323, 324.

The corner zone 301 being occupied by the winding 32, an end of the winding 31 extends substantially as far as a side of the winding 32. The turn 317 situated at the end of the winding 31 as well as the other turns 316, 315 of the winding 31 are oriented substantially perpendicularly with respect to the turns 321, 322, 323, 324 of the winding 32.

It is therefore apparent that the number of turns per unit length along the axis Y1 is not constant over the contour of the polygon 300; preferentially, the coiling axes Y1 and Y2 also being axes of symmetry of the support 35, $N_{corner}$ turns are consequently missing from the winding 31 along the axis Y1.

In the corner zone 201, the winding 21 has $N_{corner}$ turns 220, 221 outside of the contour of the polygon 200 whilst the winding 22 does not comprise any turn in this same zone.

In the corner zone 301, the winding 31 does not comprise any turn whilst the winding 32 has $N_{corner}$ turns (321, 322) outside of the contour of the polygon 300 in this same zone.

The winding 21 being facing the winding 31, the axes X1 and Y1 being parallel, the $N_{corner}$ turns 220, 221 of the winding 21 in the corner zone 201 outside of the contour of the polygon 200 sense substantially the same magnetic field as the turns 316, 317 of the winding 3, thereby compensating for the missing turns of the winding 31 in the corner zone 301.

The same holds for the windings 22 and 32: the winding 22 being facing the winding 32, and the axes X2 and Y2 being parallel, the $N_{corner}$ turns 321, 322 of the winding 32 in the corner zone 301 outside of the contour of the polygon 300 sense substantially the same magnetic field as the turns 225, 226 of the winding 2, thereby compensating for the missing turns of the winding 22 in the corner zone 201.

An end of the winding 21 of the first layer of coils 2 occupies the corner zone 201, the turns are oriented perpendicularly to the axis X1. An end of the winding 32 of the second layer of coils 3 occupies the corner zone 301, the turns are oriented perpendicularly to the axis Y2. The corner zones 201 and 301 being facing, X1 being perpendicular to Y2, the orientation of the turns of the winding 21 of the first layer of coils 2 is different from the orientation of the turns of the winding 32 of the second layer of coils 3. According to the preferential embodiment represented in FIG. 1, the turns of the winding 21 in the corner zone 201 of the first layer of coils 2 are oriented substantially at right angles with respect to the turns of the winding 32 in the corner zone 301 of the second layer of coils 3.

Thus therefore, the facing position of the layers of coils 2, 3, associated with the clever arrangement of the windings 21, 22, 31, 32 in the facing corner zones 201, 301, makes it possible to obtain an effect equivalent to a constant coiling pitch in the said corner zones. The coiling pitch being constant over the sides of the polygons 200, 300, the coiling pitch is therefore constant over the entire length of the layers of coils 2, 3. The sensor thus produced exhibits high insensitivity to external electromagnetic fields while being simple and economical to produce.

The particular arrangement, such as described above, of the turns of the windings 21, 22, 31, 32 in the corner zones 201 and 301 is reproduced for the windings 22, 23, 32, 33 in the corner zones 202 and 302, for the windings 23, 24, 33, 34 in the corner zones 203 and 303, and for the windings 21, 24, 31, 34 in the corner zones 204 and 304.

Figure 3C:
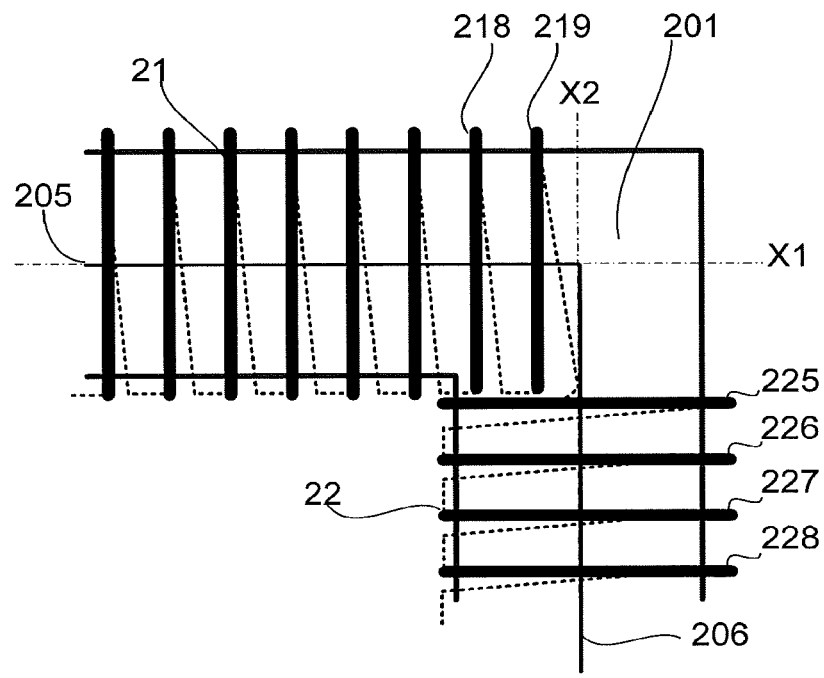
FIGS. 3C and 3D represent views from above of a variant of the installation of the turns of two layers of coils of the sensor in two facing corner zones.

FIG. 3C, represents a view from above of a variant of installation of the turns of the windings 21 and 22 in the corner zone 201 of the first layer of coils 2. The turns 218 to 219 of the first winding 21 are coiled along the side 205 of the polygon 200, along the axis X1. The orientation of the turns in the corner zone 201 is perpendicular to the axis X1. The corner zone 201 being occupied by the winding 21, the turn 225 situated at an end of the winding 22 extends substantially as far as a side of the winding 21. The turn 225 situated at the end of the winding 22 as well as the other turns of the winding 22 are oriented perpendicularly with respect to the turns 218 to 219 of the winding 21. It is therefore apparent that the number of turns per unit length along the axis X2 is not constant over the contour of the polygon 200: preferentially, the coiling axes X1 and X2 also being axes of symmetry of the support 25, $N_{corner}$ turns are consequently missing from the winding 22 along the axis X2.

Figure 3D:
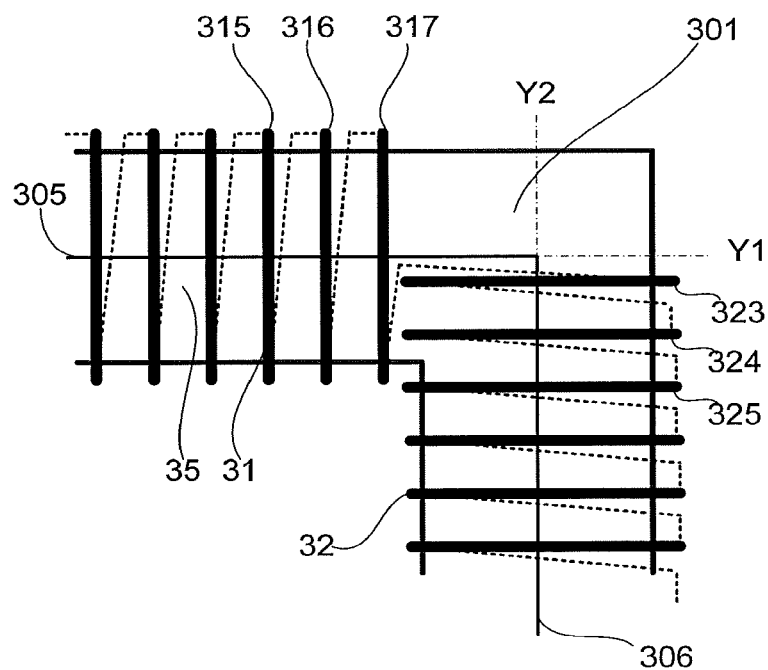

FIG. 3D represents a view from above of a variant of installation of the turns of the windings 31 and 32 of the second layer of coils 3, in the corner zone 301, situated facing the corner zone 201. The turns 323, 324 of the second winding 32, coiled along the axis Y2, along the side 306 of the polygon 300, occupy the corner zone 301.

The corner zone 301 being occupied by the winding 32, the turn 317 situated at an end of the winding 31 extends substantially as far as a side of the winding 32.

Thus in the facing corner zones 201, 301, the orientation of the turns of the winding 21 of the first layer of coils 2 is different from the orientation of the turns of the winding 32 of the second layer of coils 3. According to the embodiment represented in FIGS. 3C and 3D, the turns of the winding 21 in the corner zone 201 of the first layer of coils 2 are oriented substantially at right angles with respect to the turns of the winding 32 in the corner zone 301 of the second layer of coils 3.

The particular arrangement, such as described above, of the turns of the windings 21, 22, 31, 32 in the corner zones 201 and 301 is reproduced for the windings 22, 23, 32, 33 in the corner zones 202 and 302, for the windings 23, 24, 33, 34 in the corner zones 203 and 303, and for the windings 21, 24, 31, 34 in the corner zones 204 and 304.

This arrangement variant is adopted when technical production imperatives oppose the production of a constant coiling pitch of the turns in the corner zone.

Figure 4A:
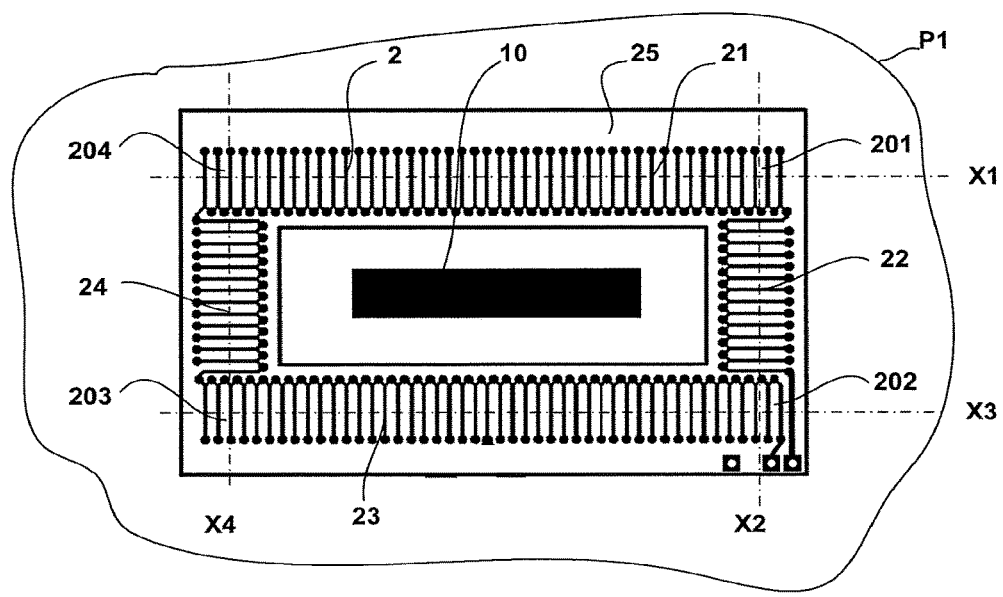
FIGS. 4A and 4B represent, viewed from above, a first embodiment of a first and second layer of coils.
Figure 4B:
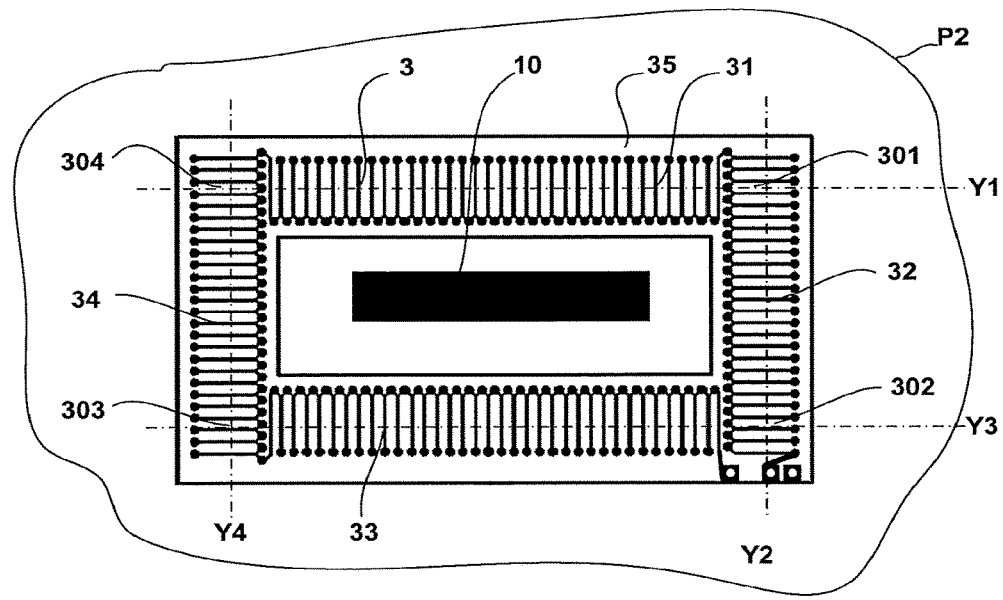

FIG. 4A represents a first embodiment of the layer of coils 2 of the invention and FIG. 4B represents a first embodiment of the layer of coils 3 of the invention. The support 25 of the layer of coils 2 and the support 35 of the layer of coils 3 are produced in the form of printed circuits, preferentially double-sided.

The layers of coils 2 and 3 are intended to be overlaid, the corner zone 201 facing opposite the corner zone 301, the corner zone 202 facing opposite the corner zone 302, the corner zone 203 facing opposite the corner zone 303 and the corner zone 204 facing opposite the corner zone 304.

An end of the winding 21 of the first layer of coils 2 occupies the corner zone 201, the turns are oriented perpendicularly to the axis X1. An end of the winding 32 of the second layer of coils 3 occupies the corner zone 301, the turns are oriented perpendicularly to the axis Y2. X1 being perpendicular to Y2, the orientation of the turns of the winding 21 of the first layer of coils 2 is different from the orientation of the turns of the winding 32 of the second layer of coils 3 in the facing corner zones 201 and 301.

An end of the winding 23 of the first layer of coils 2 occupies the corner zone 202, the turns are oriented perpendicularly to the axis X3. An end of the winding 32 of the second layer of coils 3 occupies the corner zone 302, the turns are oriented perpendicularly to the axis Y2. X3 being perpendicular to Y2, the orientation of the turns of the winding 23 of the first layer of coils 2 is different from the orientation of the turns of the winding 32 of the second layer of coils 3 in the facing corner zones 202 and 302.

An end of the winding 23 of the first layer of coils 2 occupies the corner zone 203, the turns are oriented perpendicularly to the axis X3. An end of the winding 34 of the second layer of coils 3 occupies the corner zone 303, the turns are oriented perpendicularly to the axis Y4. X3 being perpendicular to Y4, the orientation of the turns of the winding 23 of the first layer of coils 2 is different from the orientation of the turns of the winding 34 of the second layer of coils 3 in the facing corner zones 203 and 303.

An end of the winding 21 of the first layer of coils 2 occupies the corner zone 204, the turns are oriented perpendicularly to the axis X1. An end of the winding 34 of the second layer of coils 3 occupies the corner zone 304, the turns are oriented perpendicularly to the axis Y4. X1 being perpendicular to Y4, the orientation of the turns of the winding 21 of the first layer of coils 2 is different from the orientation of the turns of the winding 34 of the second layer of coils 3 in the facing corner zones 204 and 304.

It is possible to create multiple variant embodiments of the layers of coils 2, 3 by coiling along one of the two axes in each corner zone of one of the layers of coils and by coiling along the other of the two axes of the facing corner zone so as to obtain a different orientation of the turns of the winding of the first layer of coils 2 from the orientation of the turns of the winding of the second layer of coils 3. A quincuncial arrangement is thus obtained of the windings of each coiling layer in each facing corner zone.

Figure 5A:
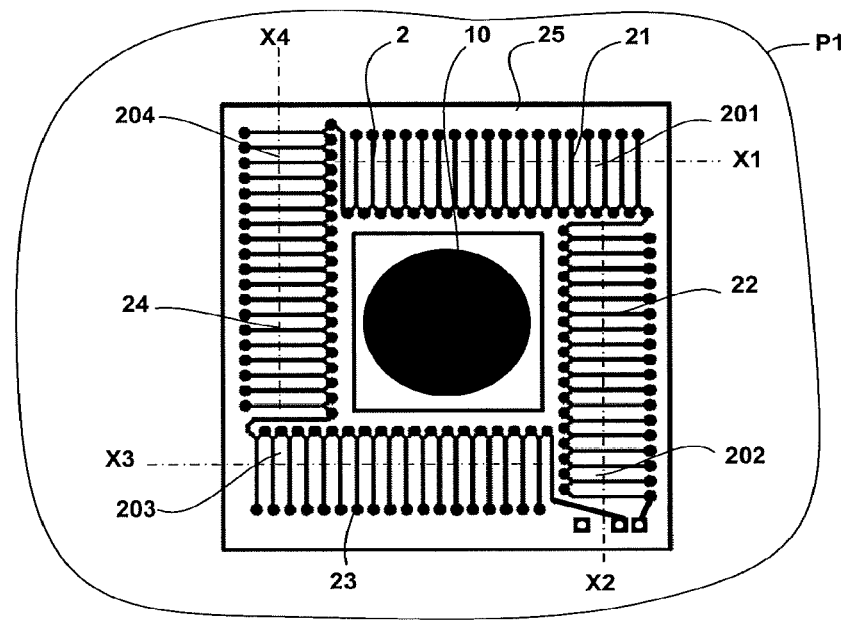
FIGS. 5A and 5B represent, viewed from above, a second embodiment of a first and second layer of coils.
Figure 5B:
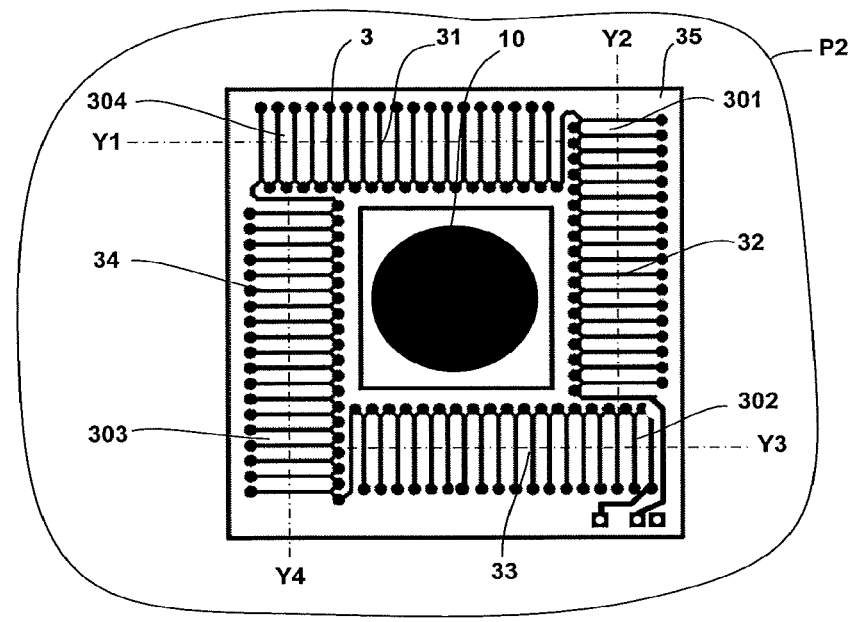

FIG. 5A represents another embodiment of the layer of coils 2, FIG. 5B represents another embodiment of the layer of coils 3. The first polygon 200 and the second polygon 300 are squares. The current line 10 is of circular cross-section, for example in the case where the current line is an electrical cable.

The layers of coils 2 and 3 are intended to be overlaid, the corner zone 201 facing opposite the corner zone 301, the corner zone 202 facing opposite the corner zone 302, the corner zone 203 facing opposite the corner zone 303 and the corner zone 204 facing opposite the corner zone 304.

An end of the winding 21 of the first layer of coils 2 occupies the corner zone 201, the turns are oriented perpendicularly to the axis X1. An end of the winding 32 of the second layer of coils 3 occupies the corner zone 301, the turns are oriented perpendicularly to the axis Y2. X1 being perpendicular to Y2, the orientation of the turns of the winding 21 of the first layer of coils 2 is different from the orientation of the turns of the winding 32 of the second layer of coils 3 in the facing corner zones respectively 201 and 301.

An end of the winding 22 of the first layer of coils 2 occupies the corner zone 202, the turns are oriented perpendicularly to the axis X2. An end of the winding 33 of the second layer of coils 3 occupies the corner zone 302, the turns are oriented perpendicularly to the axis Y3. X2 being perpendicular to Y3, the orientation of the turns of the winding 22 of the first layer of coils 2 is different from the orientation of the turns of the winding 33 of the second layer of coils 3 in the facing corner zones respectively 202 and 302.

An end of the winding 23 of the first layer of coils 2 occupies the corner zone 203, the turns are oriented perpendicularly to the axis X3. An end of the winding 34 of the second layer of coils 3 occupies the corner zone 303, the turns are oriented perpendicularly to the axis Y4. X3 being perpendicular to Y4, the orientation of the turns of the winding 23 of the first layer of coils 2 is different from the orientation of the turns of the winding 34 of the second layer of coils 3 in the facing corner zones respectively 203 and 303.

An end of the winding 24 of the first layer of coils 2 occupies the corner zone 204, the turns are oriented perpendicularly to the axis X4. An end of the winding 31 of the second layer of coils 3 occupies the corner zone 304, the turns are oriented perpendicularly to the axis Y1. X4 being perpendicular to Y1, the orientation of the turns of the winding 24 of the first layer of coils 2 is different from the orientation of the turns of the winding 31 of the second layer of coils 3 in the facing corner zones respectively 204 and 304.

The invention is not limited to the embodiments presented in FIGS. 4A, 4B, 5A and 5B. Other shapes can be chosen for the first polygon 200 and the second polygon 300: trapezium, pentagon, hexagon, octagon, this list being wholly non-limiting. For example in the case of a regular pentagon, the turns of the winding occupying the corner zone 201 of the first layer of coils 2 are oriented substantially at 108° with respect to the turns of the winding occupying the corner zone 301 of the second layer of coils 3. The orientation will be substantially 135° in the case of a regular octagon.

The examples of FIGS. 1, 4A, 4B, 5A, 5B show a sensor with two layers of coils 2, 3 but, as a variant, to obtain more voltage V delivered by the secondary winding of the current sensor 1, a plurality of layers of coils 2 and a plurality of layers of coils 3 can be assembled together, in so far as the number of layers of coils 2 is equal to the number of layers of coils 3. In this configuration, the layers of coils 2 are linked together electrically in series, thus forming the equivalent of a single first layer of coils 2 and the layers of coils 3 are linked together electrically in series, thus forming the equivalent of a single second layer of coils 3. The number of turns N of the resulting sensor will be equal to the sum of the number of turns of the first layer of coils 2 and of the number of turns of the second layer of coils 3 present in the assembly.

The direction of coiling of the first layer of coils 2 is preferentially reversed with respect to the direction of coiling of the second layer of coils 3. In FIG. 3A, the arrow 291 on the turn 221 of the winding 21 and the arrow 292 on the turn 227 of the winding 22 indicate the direction of coiling of the layer of coils 2. In FIG. 3B, the arrow 391 on the turn 317 of the winding 31 and the arrow 392 on the turn 325 of the winding 32 indicate the direction of coiling of the layer of coils 3. This arrangement reproduced on the set of layers of coils 2 and 3 makes it possible to dispense with a compensating turn, the layer of coils 2 compensating for the loop effect of the layer of coils 3 and vice versa the layer of coils 3 compensating for the loop effect of the layer of coils 2.

The coiling supports 25, 35 are made of a magnetic material. They may be hollow or solid, rigid or semi-rigid, of cylindrical, square, rectangular or ovoid cross-section, produced in monobloc form or assembled in pieces.

Each layer of coils 2, 3 can be produced using printed circuit technology, the supports 25, 35 being made of material conventionally used by this technology for example epoxy, glass fibre or a ceramic, on which tracks forming the winding are deposited, silk-screen-printed or etched. The continuity of the winding between the two faces of each support 25, 35 is produced by metallized holes, also called "vias".

The electrical link between the various coils is ensured by tracks formed according to the same method as the winding. The printed circuit used is preferentially double-sided. It is possible to use a multilayer printed circuit.

In another particular embodiment, each layer of coils 2, 3 of the current sensor 1 is produced by depositing an electrically conducting material (for example copper) on a support respectively 25, 35 made of insulating material (for example a polymer material (such as polyamide or polycarbonate) or ceramic or else glass) by means of a silk-screen printing technique.

In another particular embodiment, each layer of coils 2, 3 of the current sensor is produced by three-dimensional printing.

The embodiments presented of the layers of coils 2, 3 are not limiting. The latter will be able to be produced by any technological means known by the person skilled in the art.

The two layers of coils 2, 3 are preferentially fixed to one another. In the case of production by printed circuit technology, spigots ensure the electrical linking and mechanical holding of the two facing layers of coils. Assembly can also be carried out by a gluing or welding procedure.

The set of windings can thus be produced on a monobloc support which is easy to manipulate. This technology lends itself particularly well to low-cost large-scale industrial production.

Figure 6:
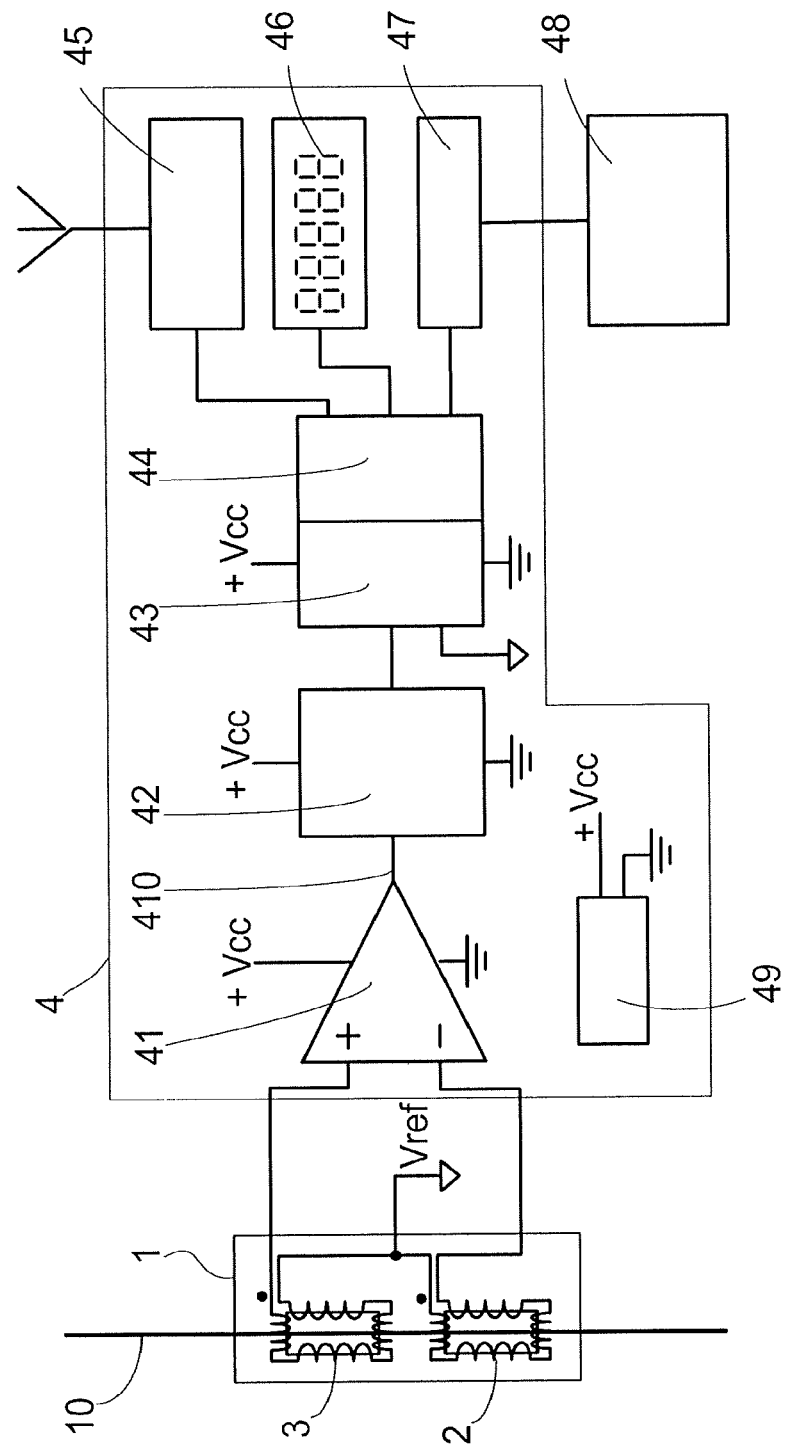
FIG. 6 represents a block diagram of a measuring apparatus integrating a current sensor according to the invention.

The current sensor 1 of the invention is particularly intended to be integrated into an electrical current or power or energy measuring apparatus. FIG. 6 represents a block diagram of such a measuring apparatus. Each first layer of coils 2 and second layer of coils 3 possesses a negative-polarity input and a positive-polarity output. Each of the positive-polarity outputs is marked with a dot in FIG. 6. The negative-polarity input of a layer of coils corresponds to the end of a first turn coiled in the direction of coiling, the positive-polarity output of a layer of coils corresponds to the end of a last turn coiled in the direction of coiling.

The positive-polarity output of the first layer of coils 2 is linked electrically with the negative-polarity input of the second layer of coils 3. This equipotential link is preferentially connected to a reference potential Vref of the measurement circuit 4.

The negative-polarity input of the first layer of coils 2 is linked electrically to a negative-polarity input of an amplifier 41 preferentially of differential type, the positive-polarity output of the second layer of coils 3 is linked electrically to a positive-polarity input of the amplifier 41. The amplifier 41 performs the amplification of the voltage difference measured between its positive-polarity input and its negative-polarity input with respect to the reference potential Vref. The signal 410 output by the differential amplifier 41 is integrated by an integrator circuit 42 and then converted by an analogue to digital converter 43 into a digital quantity processed by a microprocessor-based calculation unit 44. This calculation unit performs the calculations suitable for making the value of the current flowing in the electrical conductor 10 available to the user, for example in the form of a value displayed on a display 46 or communicated by means of a radio communication module 45 or wired communication module 47 to a processing unit 48 outside the measuring apparatus 4. The various modules 41 to 44 constitute processing circuits connected to the current sensor 1 and suitable for receiving at least one signal representative of the current flowing in the current conductor 10. The various modules 41 to 48 are supplied by a power supply 49 providing a voltage Vcc. The power supply 49 can tap off its energy either from the current conductor 10 or through an independent external source. Other embodiments for processing the voltage delivered by the coils 2 and 3 can be envisaged, for example with one or more circuits implementing an analogue processing of the signals.

Figure 7:
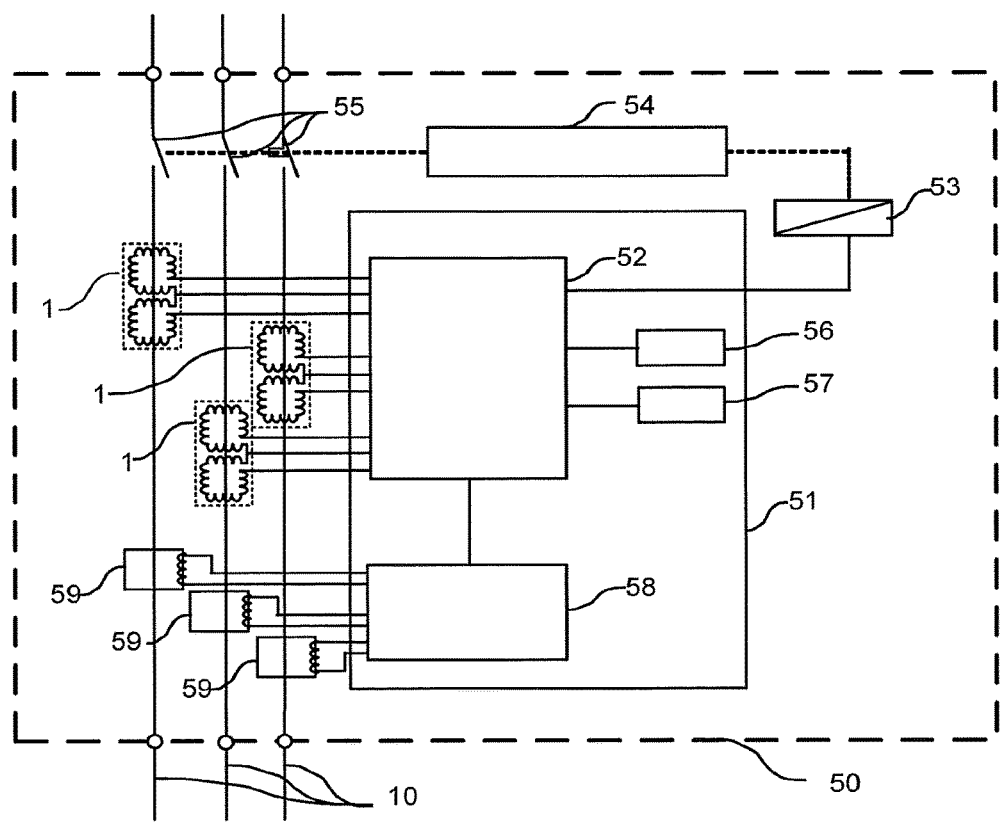
FIG. 7 represents a block diagram of a switching device integrating a plurality of current sensors according to the invention.

A plurality of current sensors 1 of the invention can also be integrated into an switching device such as a circuit breaker 50 equipped with an electrical trip unit 51 as represented in FIG. 7. A circuit breaker is generally installed on a three-phase network and comprises three current lines 10 corresponding to each of the phases of the electrical network. A fourth current line can be used as neutral conductor. A current sensor 1 surrounds each of the current conductors 10. An electrical trip unit 51 comprises one or more processing circuits 52 connected to the said current sensors 1 and suitable for receiving at least one signal representative of the current flowing in each of the current conductors 10. The circuit breaker 50 furthermore comprises a mechanism for opening electrical contacts 54, the said mechanism being linked to the trip unit by a relay 53 so as to open the electrical contacts 55. The circuit breaker 50 also comprises a display module 56 making it possible to display measurements and indications formulated by the processing circuits and a communication module 57 making it possible to transmit the measurements and the indications by radio or wired link.

A power supply module 58 using the energy tapped off by power supply sensors 59 from the current conductors 10 provides energy to the various modules constituting the electrical trip unit 51.

A plurality of modes of industrial production of the sensors 1 are possible for installation in a measuring apparatus or in a three-phase circuit breaker in order to enable large-scale industrial production while guaranteeing very good alignment of the layers of coils 2 and 3 with respect to one another and very good accuracy of production of the coils:

- a first variant consists in producing the first layer of coils 2 of all the sensors by means of a printed circuit also carrying all or part of the processing circuits 52 and in producing each layer of coils 3 of each sensor 1 by means of an independent printed circuit,
- a second variant for which each sensor 1 is produced by means of a single printed circuit comprising at least four high-quality printing layers, two layers being intended for the coil layer 2, the other two layers being intended for the coil layer 3, and
- a third variant for which a single printed circuit, comprising at least four high-quality printing conducting layers, is used to integrate the layers of coils 2, 3 of all the sensors 1 as well as all or part of the processing circuits 52.

The connections between the various conducting layers are produced by means of links called "vias". These links generally have an access on the external faces of the printed circuit but they can also be totally blind ("blind vias") so as to retain the planarity and the perfect similarity of the internal layers of the sensors 1 and thus guarantee measurement accuracy. In all these modes of production, the printed circuits comprise the recesses necessary for the passage of the current lines.

The current sensor 1 of the invention is particularly suitable for installation in a measuring apparatus or in an apparatus for protecting or controlling electrical circuits in industrial settings since it can be produced in an economical manner, its installation is compact, well suited to the shape of the circuit breaker 50 and affords excellent measurement accuracy and high insensitivity to external electromagnetic fields by virtue of the constant coiling pitch over the entire length of the coils 2, 3.

The invention claimed is:

1. A Rogowski current sensor, comprising:
    a first layer of coils and a second layer of coils configured to surround a current conductor so as to perform a measurement of a current flowing in the current conductor,
    the first layer of coils comprising a first plurality of windings linked together, each winding of the first plurality having a longitudinal axis arranged in a first plane and first turns that are substantially perpendicular to said longitudinal axis, crossovers of the longitudinal axes of said each winding of the first plurality forming first corner zones corresponding to vertices of a first polygon in the first plane,
    the second layer of coils comprising a second plurality of windings linked together, each winding of the second plurality having a longitudinal axis arranged in a second plane, parallel to the first plane, and second turns that are substantially perpendicular to said longitudinal axis, crossovers of the longitudinal axes of said each winding of the second plurality forming second corner zones corresponding to vertices of a second polygon in the second plane, and
    the first and second polygons being disposed facing one another such that each of the first corner zones of the first polygon is respectively situated facing a corresponding each of the second corner zones of the second polygon,
    wherein in each of the first and the second corner zones, an orientation of the first turns of the winding of the first layer of coils is different from an orientation of the second turns of the winding of the second layer of coils in a facing corner zone.

2. The current sensor according to claim 1, wherein said each of the first and the second corner zones is occupied by an end of a single winding, and an end of an adjacent winding thereto extends substantially as far as a side of the single winding occupying said each of the first and the second corner zones.

3. The current sensor according to claim 2, wherein the longitudinal axis of said each winding of the first plurality along each side of the first polygon is parallel to the longitudinal axis of said each winding of the second plurality along each side of the second polygon facing thereto.

4. The current sensor according to claim 1, wherein the windings of the first plurality are linked in series and the windings of the second plurality are linked in series.

5. The current sensor according to claim 1, wherein a direction of coiling of the windings of the first plurality is reversed with respect to a direction of coiling of the windings of the second plurality.

6. The current sensor according to claim 1, wherein a shape of the first and the second polygons is a rectangle or a square.

7. The current sensor according to claim 6, wherein for each corner zone of the first and the second polygons, the first turns of the winding of the first plurality in the first corner zones are oriented substantially at right angles with respect to the second turns of the winding of the second plurality in the second corner zones facing thereto.

8. The current sensor according to claim 1, wherein coils of the first and the second layers of coils are produced according to a printed circuit technique.

9. The current sensor according to claim 1, wherein coils of the first and the second layers of coils are produced by depositing an electrically conducting material on an insulating support with a silk-screen printing technique.

10. The current sensor according to claim 1, wherein coils of the first and the second layers of coils are produced according to a three-dimensional printing technique.

11. An apparatus for measuring electrical power or energy, comprising:
at least one current sensor linked to at least one circuit configured to process a signal representative of a current flowing in at least one current conductor; and
at least one current sensor according to claim 1.

12. The apparatus for measuring electrical power or energy according to claim 11, wherein:
a first end of the first layer of coils is linked to a reference potential of the apparatus,
a second end of the first layer of coils is linked to a first input of an amplifier,
a first end of the second layer of coils is linked to the reference potential of the apparatus, and
a second end of the second layer of coils is linked to a second input of the amplifier.

13. An electrical trip unit, comprising:
at least one current sensor according to claim 1; and
at least one processing circuit connected to the at least one current sensor and being configured to receive at least one signal representative of a current flowing in at least one current conductor.

14. A switching device, comprising:
an electrical trip unit according to claim 13; and
an electrical contact opening mechanism linked to the electrical trip unit and being configured to open electrical contacts.

* * * * *